United States Patent [19]
Bennett

[11] 4,006,438
[45] Feb. 1, 1977

[54] ELECTRO-ACOUSTIC SURFACE-WAVE FILTER DEVICE

[75] Inventor: Glenn Edward Bennett, Harrisburg, Pa.

[73] Assignee: AMP Incorporated, Harrisburg, Pa.

[22] Filed: Aug. 18, 1975

[21] Appl. No.: 605,584

[52] U.S. Cl. .............................. 333/72; 310/8.2; 310/9.8; 333/30 R
[51] Int. Cl.$^2$ ..................... H03H 9/04; H03H 9/26; H03H 9/32; H01L 41/10
[58] Field of Search ............ 333/72, 30; 310/8, 8.1, 310/8.2, 9.8

[56] References Cited

UNITED STATES PATENTS

| | | | |
|---|---|---|---|
| 3,727,155 | 4/1973 | De Vries | 333/72 |
| 3,801,937 | 4/1974 | Bristol | 333/72 |
| 3,872,410 | 3/1975 | Zucker | 333/72 |

OTHER PUBLICATIONS

Moulic et al.—"Surface Acoustic Wave Harmonic Response Cancellation Technique" in IBM Technical Disclosure Bulletin, July 1975; pp. 521–522.
Holland et al.—"Practical Surface Acoustic Wave Devices" in Proceedings of the IEEE vol. 62, No. 5, May 1974; pp. 582–586.

*Primary Examiner*—Alfred E. Smith
*Assistant Examiner*—Marvin Nussbaum
*Attorney, Agent, or Firm*—Russell J. Egan

[57] ABSTRACT

An improved miniaturized electro-acoustic surface-wave filter device is disclosed having broad, deep, adjacent channel stopbands from uniform aperture transducers. The device includes two spaced, interdigital electrode transducer structures fabricated on one surface of a piezoelectric substrate. Each electrode structure includes a central finger group and a number of flanking finger groups spaced from the central finger group at predetermined temporal locations. The strengths of the flanking groups are adjusted by controlling the number of finger pairs within a group, the overlap length of the fingers, and the strip/gap ratio of the fingers. Aperture uniformity is maintained in reduced overlap flanking groups through the series weighting technique. The subject device is particularly useful for channel selection in the IF portion of a television receiver.

15 Claims, 13 Drawing Figures

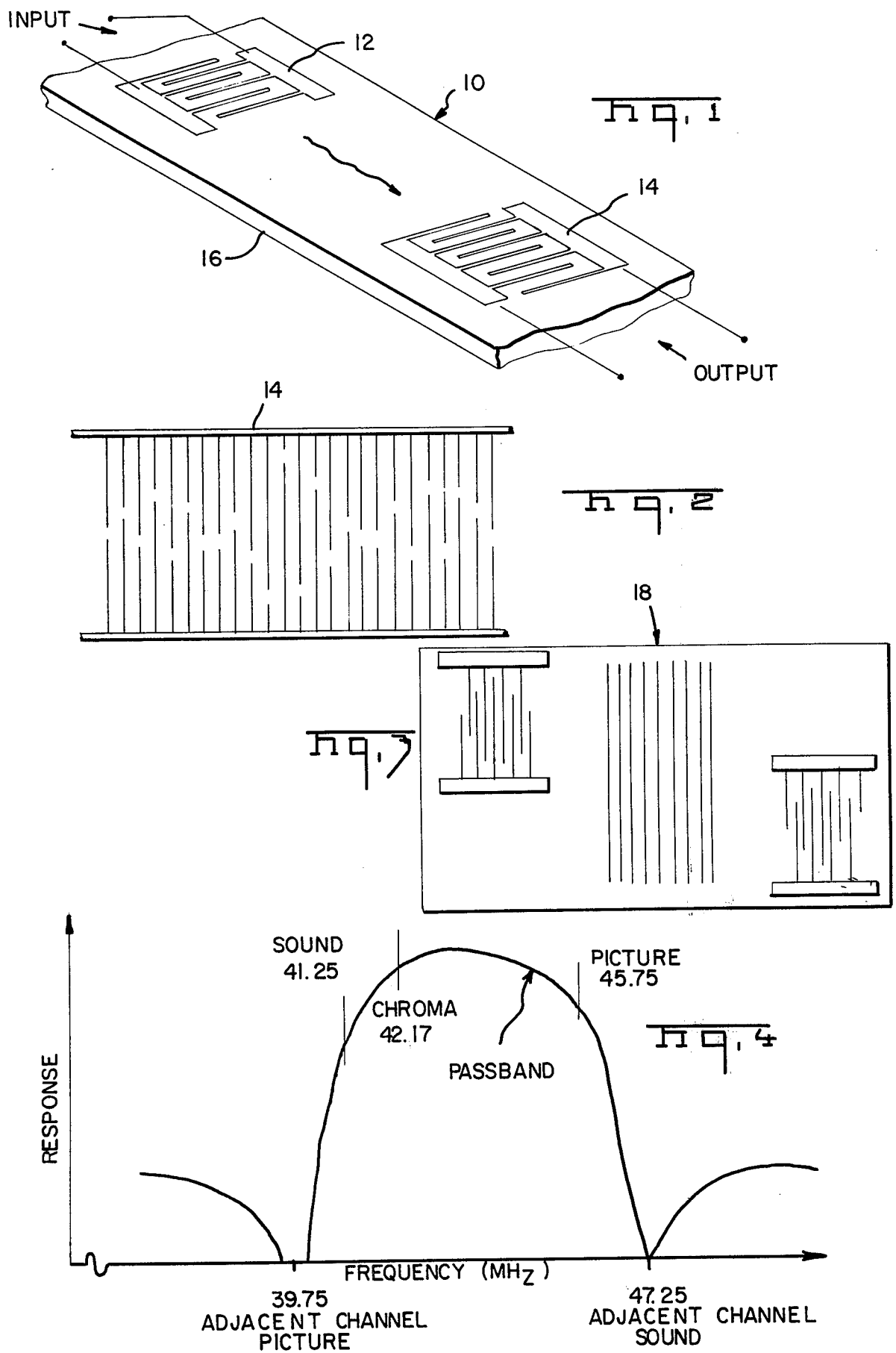

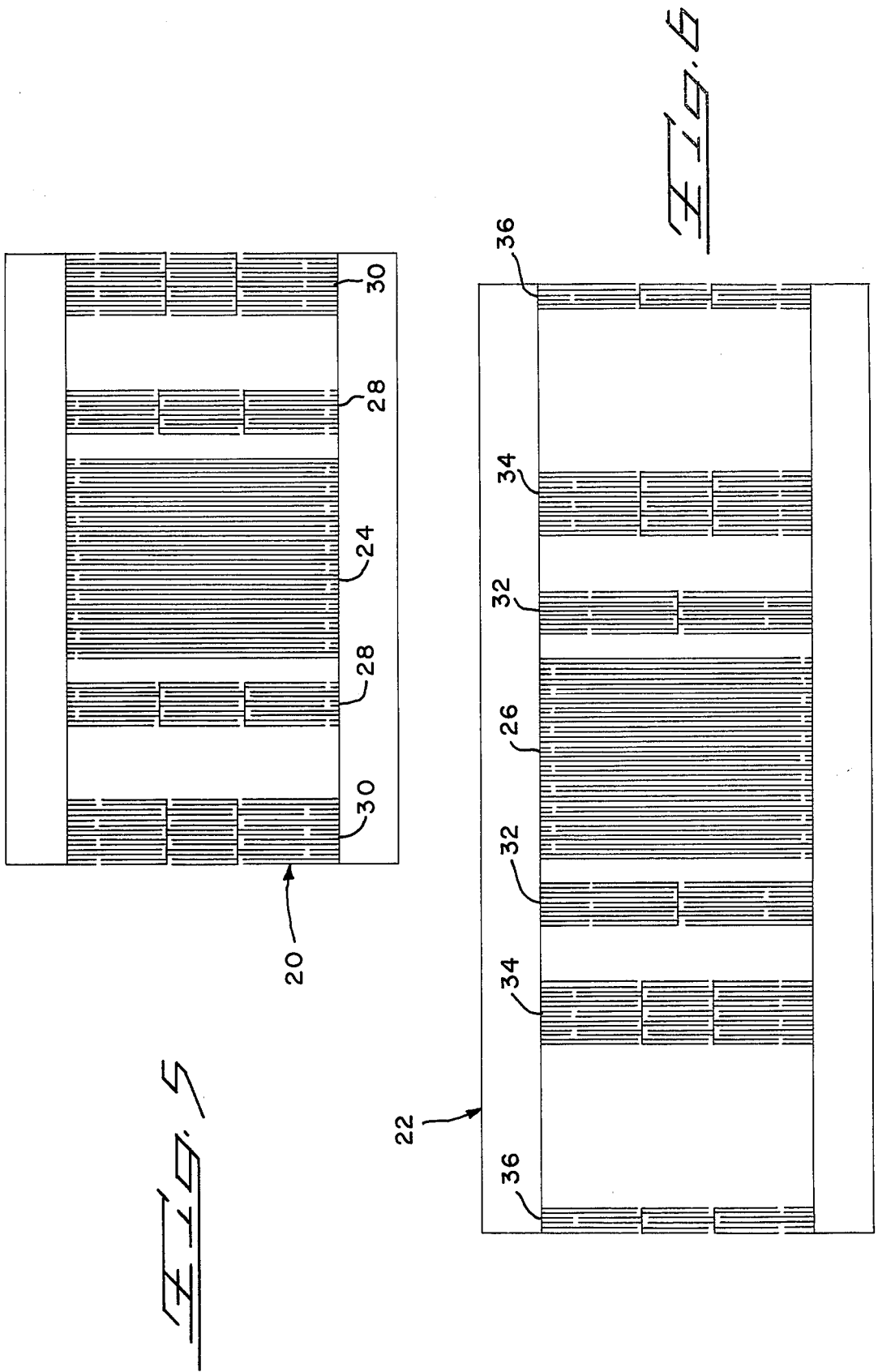

FREQUENCY RESPONSE

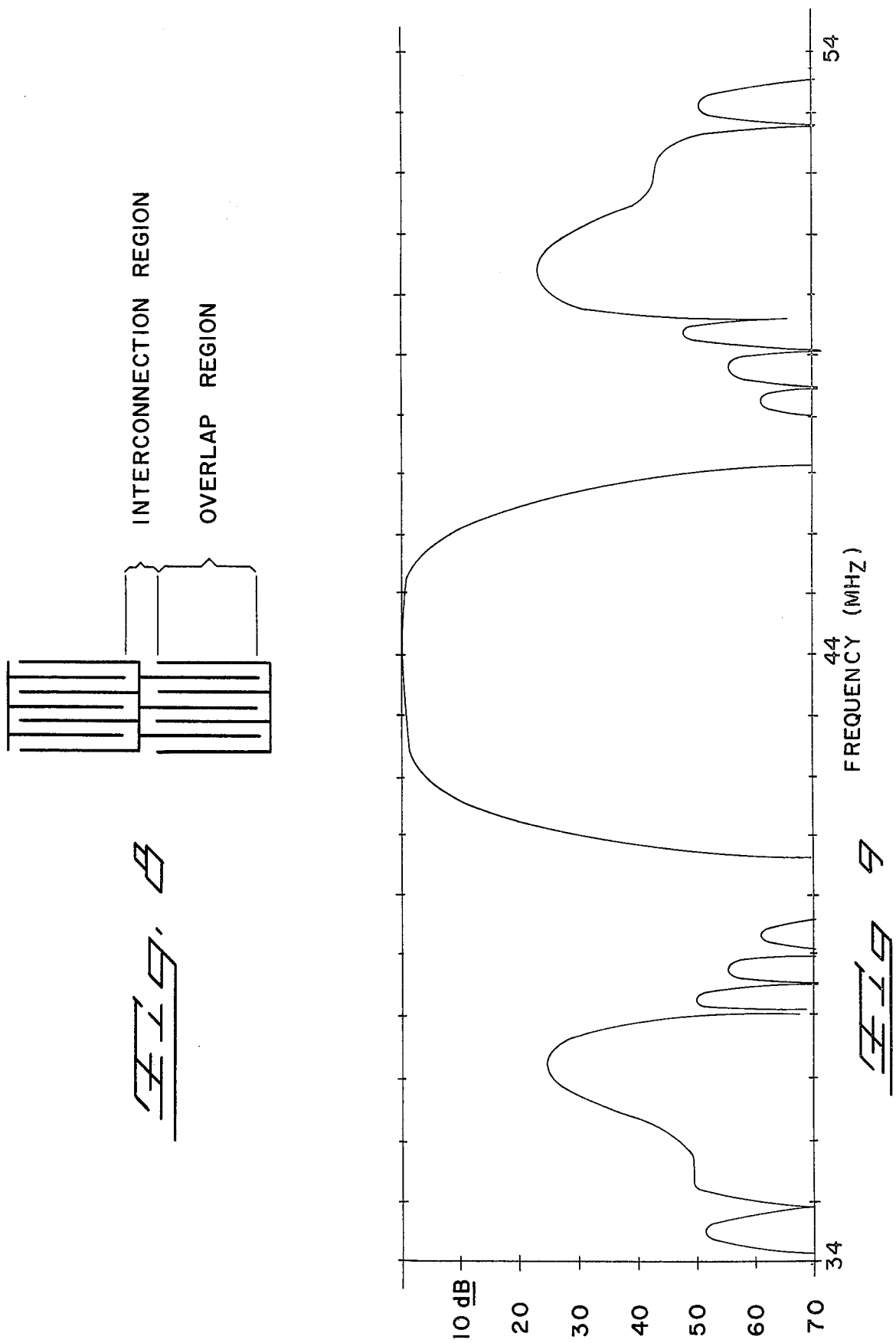

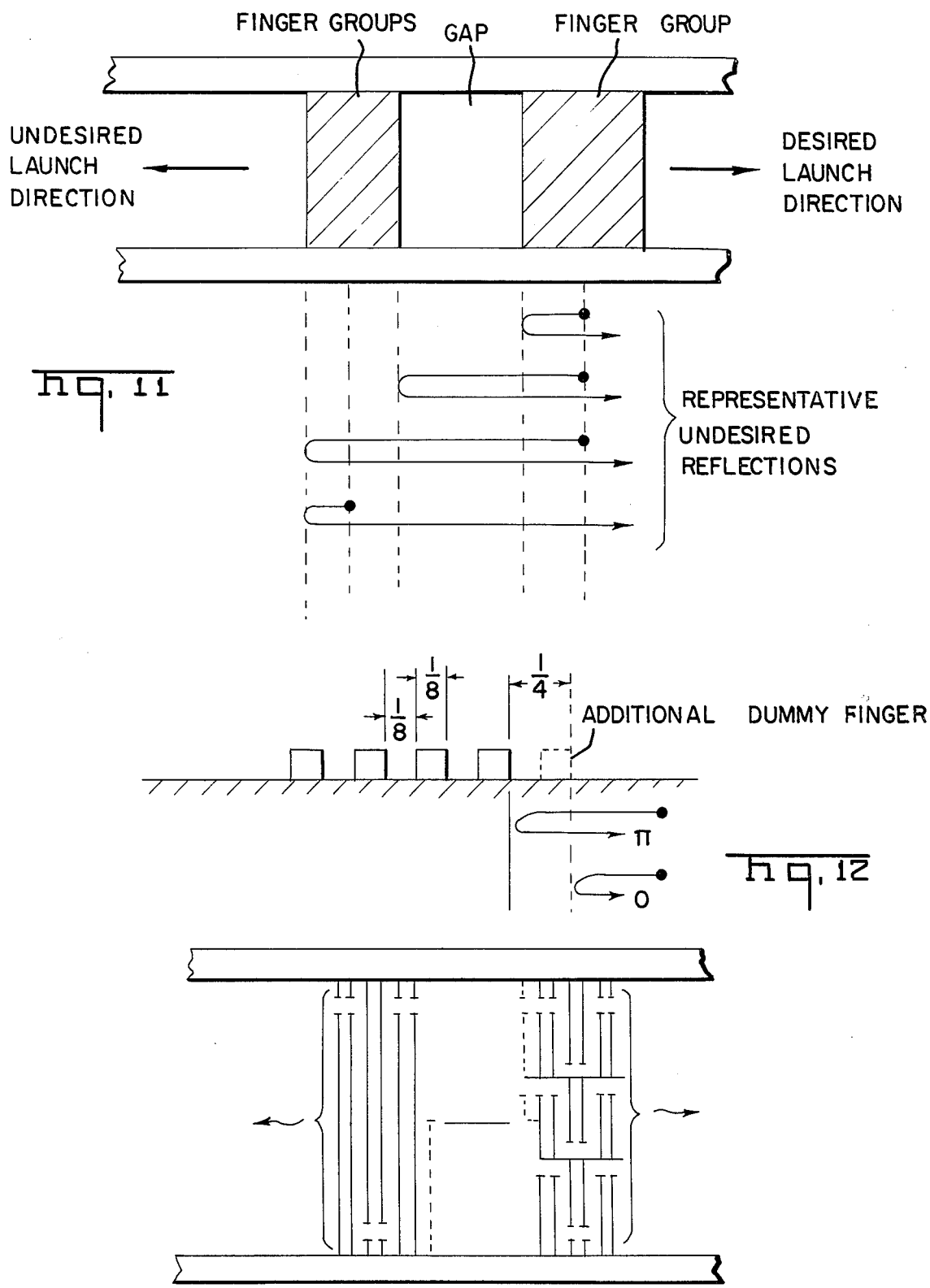

ELECTRO-ACOUSTIC SURFACE-WAVE FILTER DEVICE

BACKGROUND OF THE INVENTION

1. The Field of The Invention

The present invention relates to an improved, miniaturized electro-acoustic surface-wave filter device and in particular to an improved transducer configuration.

2. Description of the Prior Art

Conventional surface-wave filters employ two interdigital electrode transducer structures fabricated on the surface of a piezoelectric substrate. The detailed design of these transducers determines the frequency response of the filter. Sophisticated filter design usually involves varying the finger overlap within a transducer, a process termed apodization. Several examples of the prior art are briefly discussed below.

U.S. Pat. No. 3,360,749 describes an interdigital electrode structure, fabricated onto one surface of a piezoelectric substrate for the purpose of launching surface elastic waves.

U.S. Pat. No. 3,515,911 describes the design and fabrication of an acoustic surface-wave transducer whose desired impulse response is expressed as the convolution of two separate pulse sequences, one sequence is embodied in a stack of piezoelectric bulk wave transducer elements and passive pacers, the second is embodied in an arrangement of mechanical feet which are attached both to the bottom of the transducer stack and to the intended substrate.

U.S. Pat. No. 3,573,673 discloses several ways to reduce the magnitude of crosstalk between first and second transducing devices spaced on the same surface of a body of piezoelectric material. These include: grounding adjacent electrodes of the two transducers; the inclusion of slanted shield electrodes; a balanced drive for the transducers; and shielding channels on the backside of the body. An angled orientation with respect to the ends of the body is employed to reduce edge reflections. U.S. Pat. No. 3,582,838 relates to a surface-wave device having unapodized combs in which the number of electrodes determines the trap frequencies. This device is also inductively resonated.

U.S. Pat. No. 3,600,710 discloses the use of transducers connected in series for impedance scaling but does not discuss this technique applied to shaping the transducer frequency response.

U.S. Pat. No. 3,663,899 suggests a surface-wave electro-acoustic filter having a transducer formed by overlapping, uniformly spaced teeth which define the Fourier transform of the transfer function of the device when operated as a filter.

U.S. Pat. No. 3,699,364 shows the use of dummy electrodes for eliminating phase distortion in the transducer portion of an apodized surface-wave device.

U.S. Pat. No. 3,727,155 discloses the use of quarter-wavelength-spaced electrodes ("split fingers") to reduce reflections between acoustic surface-wave transducers.

U.S. Pat. No. 3,792,381 employs flanking electrode arrays spaced within one wavelength of, and in a phase reversal relationship with, the central array of an acoustic surface-wave transducer in order to achieve some control over the frequency response.

U.S. Pat. No. 3,801,935 arranges transducer electrode groups within a uniformly spaced electrode array such that they are electrically and acoustically in series, thereby, achieving impedance scaling and some control over the shape of the transducer frequency response.

U.S. Pat. No. 3,801,937 teaches the use of flanking electrode arrays in an unapodized acoustic surface-wave transducer, these flanking arrays being so positioned and phased with respect to a central array as to provide cosine-on-a-pedestal frequency response over a specified bandwidth as required for temporal sidelobe suppression in dispersive pulse compression filters.

U.S. Pat. No. 3,836,876 discloses the principle of the multistrip coupler, used as a track changing means in acoustic surface-wave devices to provide suppression of undesired bulk wave modes. Subsequently it has been employed to effectively combine the responses of two apodized transducers in a surface-wave device.

Those skilled in this art have generally been unable to design filters employing apodization of both transducers without the use of a multistrip coupler (MSC). Thus, the designer is ordinarily constrained to use to best advantage the relatively inflexible response of one unapodized transducer, or to more than double the filter area in order to make use of the multistrip coupler.

Substrate cost is a principal determinent in the final cost of a commercial surface-wave filter. Thus minimization of the electroded area is an important design goal. The size of an individual transducer is naturally governed by its length (measured perpendicular to the long axes of the interdigital electrodes) and width (measured parallel to the long axes of the interdigital electrodes). The length is largely predetermined by the specified filter frequency response, and is relatively inflexible. The width or aperture may be reduced, but diffraction of the launched acoustic beam sets a lower limit. If the width is reduced into the diffraction region, rather intractable phase and amplitude distortions degrade the filter response, particularly in critical stopband and/or trap regions. Clearly an unapodized transducer can be width-reduced further than one containing a great number of small-overlap fingers.

The important requirements of a television IF filter are a specified passband, with strong rejection of picture and sound carriers from adjacent channels. Meeting this specification with a surface-wave filter ordinarily requires either an apodized transducer with wide aperture, or else judicious placement of the deep, narrow null responses of an unapodized design.

SUMMARY OF THE INVENTION

The subject acoustic surface wave filter device provides a specified passband and broad, deep, adjacent channel stopbands from uniform aperture transducers by fabricating, on a piezoelectric substrate, two spaced interdigital electrode structures each having a central finger group and at least one flanking finger group spaced on each side thereof. The flanking finger groups are located at predetermined distances from the central group. The strengths of the flanking finger groups are adjusted by controlling the number of finger pairs within a group, the overlap length of the fingers, and the strip/gap ratio of the fingers.

It is an object of the present invention to produce an improved electro-acoustic surface-wave filter device having a specified passband with broad adjacent channel stopbands, rather than narrow traps, thereby substantially reducing or eliminating critical tuning and thermal tracking requirements in a heterodyne receiver.

It is a further object of the present invention to produce an electro-acoustic surface-wave filter device which has a minimization of diffraction effects and thus a smaller size.

It is another object of the present invention to produce an improved electro-acoustic surface-wave filter device having unapodized transducers which, on substrates where undesired bulk wave modes can be controlled or suppressed, permits superior filter design without the use of a multistrip coupler.

It is still another object of the present invention to produce an improved filter device or reduced size and relative insensitivity to terminating impedance.

It is yet another object of the present invention to produce an improved filter device which has improved phase linearity.

A still further object of the present invention is to produce an improved filter device which eliminates production and maintenance alignment requirements through consistency and stability and thus is subject to ready and economic mass manufacturing.

The means for accomplishing the foregoing and other objects and advantages will become clear to those skilled in the art from the following detailed description taken with reference to the accompanying drawings.

BRIEF DESCRIPTION OF THE DRAWINGS

FIG. 1 is a perspective view of a prior art electro-acoustic surface-wave filter;

FIG. 2 is a plan view showing the finger overlap pattern within one transducer of a filter, such as the one shown in FIG. 1;

FIG. 3 is a plan view of a typical filter employing a multistrip coupler;

FIG. 4 is a schematic representation of the bandpass requirements for an electro-acoustic surface-wave filter;

FIG. 5 is a plan view of a representative transducer according to the present invention for an electro-acoustic surface-wave filter;

FIG. 6 is a plan view of an alternative representative transducer according to the present invention;

FIG. 8 is a plan view of the splice detail of a series connected transducer according to the present invention;

FIG. 9 is a graphic representation of filter responses for a surface-wave device according to the present invention;

FIG. 11 is a schematic view of a portion of a launching transducer showing undesired internal reflections;

FIG. 12 is a detail plan view of a further alternate embodiment of the subject transducer for an electro-acoustic surface-wave filter device.

DETAILED DESCRIPTION OF THE PREFERRED EMBODIMENT

Figure 7:
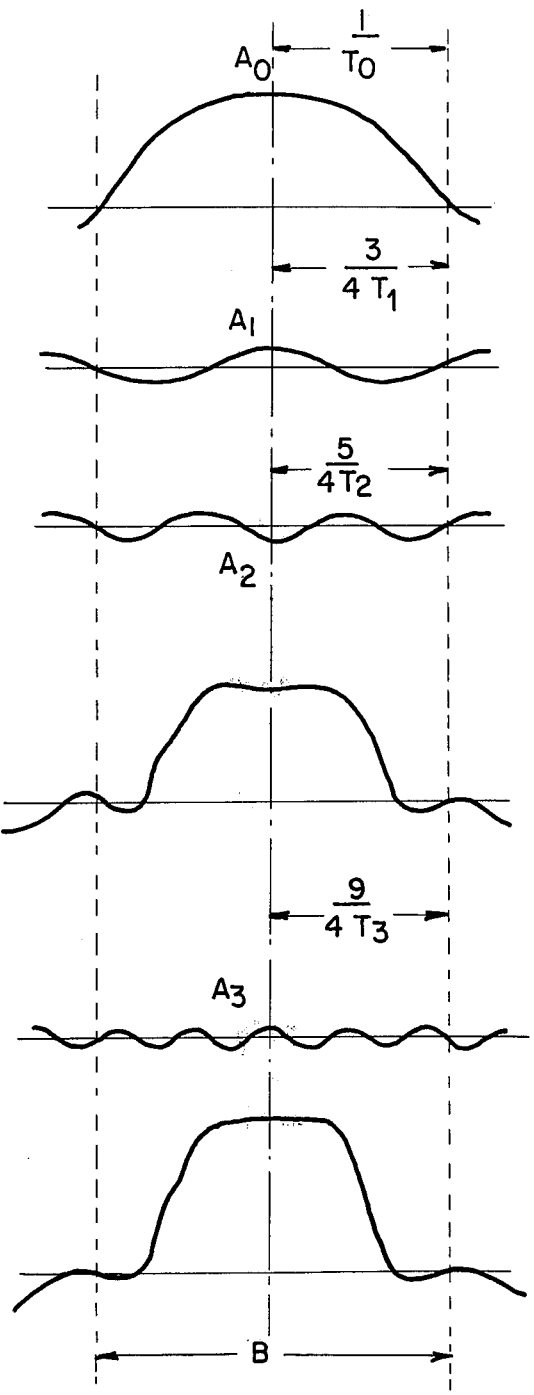
FIG. 7 is a schematic representation of the frequency response for the transducer components of an electro-acoustic surface-wave filter device according to the present invention.

Conventional surface-wave filters 20 employ two interdigital electrode transducer structures 12, 14 fabricated on the surface of a piezoelectric substrate 16 (FIG. 1). The detailed design of these transducers determines the frequency response of the filter. Complex characteristics may be achieved through the technique of apodization, as shown in FIG. 2. The multistrip coupler 18 (FIG. 3) permits utilization of two apodized transducers for superior filter performance, but imposes an expensive burden in increased substrate area.

The important requirements of a television IF filter are a specified passband, with strong rejection of picture and sound carriers from adjacent channels (FIG. 4).

The present invention provides a surface-wave filter, having the specified passband and broad, deep, adjacent channel stopbands, from uniform aperture transducers. This permits great aperture reduction over other stop-band techniques, without imposing the additional tuning and tracking requirements characteristic of adjacent channel trap designs.

FIGS. 5 and 6 show two typical transducers 20, 22 based on the subject inventive concept. They each consist of a large central group of fingers 24, 26, symmetrically bracketed by several pairs of smaller groups of fingers 28, 30, 32, 34, 36, which have been weakened by series weighting, as described by Ronnekleiv, Skeie, and Hanebrekke, IEE Conference Publication No. 109, *Component Performance and Systems Applications of Surface Acoustic Wave Devices*, pp. 141–151; September, 1973. Each group is comprised of a uniform array of conventional interdigital electrodes ("split fingers" in this case) designed in the customary fashion such that each group individually would exhibit maximum response at the center frequency $f_0$. Each group is distinguished from adjacent groups, for example, either by a break in the uniform periodicity of the finger placement, and/or by reversal in the pattern of finger interleaving, and/or a change in the uniform finger overlap length. The detailed design and placement of these groups is accomplished in a systematic manner to produce broad stopbands. Predictable trap frequencies within these bands can be used to provide further adjacent channel rejection.

FIG. 7 is a schematic representation which reveals the principles operating in the subject invention. Here the finger groups have been shown only as blocks, to simplify the explanation. The subscripted T's indicate temporal placement of the groups and the A's represent group strength. With reference to FIG. 7, the subscripted temporal placement variables serve to indicate the phase delay (in seconds) which a surface wave would experience in propagating through the transducer from the geometric center of the central finger group to the geometric center of the indicated flanking group. The A's are mainly determined by the product of total number of fingers and overlap length within each group. Further adjustment is available in the electrode strip-gap ratio within each group (noted in U.S. Pat. No. 3,839,687 and also described elsewhere). The pulse and minus signs indicate whether the common bus bar electrodes within each group are connected such that the group-pair contribution adds or subtracts from the aggregate response at midband.

The basic response is produced by groups 26, 32, and 34. Group 36 provides a substantial performance improvement at the expense of a roughly 50–75% increase in transducer length.

It can be observed that group 26 creates the basic passband frequency response, with maximum response at a center frequency $f_o$ and a frequency bandwidth B between the two null response points closest to $f_o$. The addition of group 34 flattens the passband response, thereby improving the filter shape factor. The combination of groups 32 and 34 provides cancellation of the group 26 response in the vicinity of its first null. This cancellation is broad enough, with sufficiently flexible nulls, to provide adjacent channel rejection at 39.75 and 47.25 MHz. The addition of group 36 flattens the passband response further while providing additional cancellation of the residual response from groups 26, 32, and 34 in the vicinity of the group 26 null.

In place of (or in addition to) group 36 there could be an alternate group with temporal placement $T_4$ such that the relationship $B/2 = 7/(4T_4)$ holds approximately. This group would typically have negative polarity (as does group 34 in FIG. 6). This group fills somewhat the same function as group 36, and as a substitute yields a somewhat shorter transducer (inasmuch as $T_4$ is less than $T_3$). Since cancellation performance of this alternate group in the stopband region would be somewhat different from group 36, as would be its effect on the passband shape, this alternate group affords additional design flexibility.

The use of such flanking groups to provide passband shaping and to create adjacent channel stopbands is an especially important feature of the present invention in that the performance of the final device is primarily dependent only on the total strength and accurate placement of each group, rather than on details of individual fingers. The groups are generally spaced widely enough to render interactive end effects insignificant. Group strength can be adjusted by varying the number of fingers, their overlap, and the strip-gap ratio. Diffraction is minimized by series connecting small-overlap groups to approximately fill out the aperture. With some mild restrictions on design flexibility, one transducer in a filter can be constrained to exactly fill the aperture, and so launch an approximately uniform acoustic beam. This provides increased design flexibility in the second transducer while retaining the filter performance associated with two apodized transducers and a multistrip coupler. While the inclusion of more than four pairs of flanking groups is clear in principle, it is not required in most filter applications.

In applications where some degree of apodization can be tolerated, design flexibility is increased by permitting apodization of the central group in one or both transducers. Temporal placement of the flanking groups then follows the format of FIG. 7, based on the closest null response points in the frequency response of this apodized central group.

The finite temporal length of the outer finger groups 28, 30, 32, 34, 36 produces some rolloff in their frequency response characteristics, but this can be taken into account during the numerical design process. Generally this rolloff is sufficiently small in the vicinity of the main filter response as to be of little use in design.

On the other hand, the temporal length of the flanking groups can sometimes be chosen to advantage for providing benefical reduction of out-of-band sidelobes. Specifically, an unapodized flanking group with temporal length L would individually exhibit a null response at frequency points spaced approximately $\Delta f_N = N/L$ (N an integer) above and below the device center frequency, $f_o$. This characteristic is independent of the temporal position of the group. Such a null can sometimes be employed to reduce the contribution of the group to an undesired out-of-band sidelobe, without significantly affecting passband and stopband performance of the device. In addition, the response of the flanking group undergoes a 180° phase reversal at such null response points, which can be of further use in suppressing out-of-band responses.

Further flexibility can sometimes be obtained by splitting each of a symmetric pair of flanking finger groups into two subgroups, whose geometric centers are symmetrically displaced an amount $\Delta T$ from the original group temporal location. If the combined strength of the subgroup pair is retained equal to the original group strength, there need be very little change in the filter passband/stopband performance. Nulls in the flanking group frequency response are created, however, located at frequencies $\Delta f_N = (1 + 2N)/(4\Delta T)$ (N is zero or in integer) above and below the device center frequency, $f_o$. As in the previous instance, these nulls and the associated phase reversals can be employed to reduce the undesired out-of-band sidelobes.

Good design success has been achieved using a simple impulse function analytical model and split-finger construction. The design analysis is based on split-finger "units". Each unit consists of two adjacent conducting fingers attached to a common bus, each finger being an eighth wavelength wide at midband and the two fingers separated by a gap of like width. Each such split finger unit is considered in the analysis to be an impulse acoustic source located at the geometric center of the split finger unit with amplitude proportional to the overlap length existing in that region of the transducer. The outer split-finger units in each group are taken to each amplitude 0.75 of this value, and a 0.05 wavelength (midband) spatial shift towards the group center. Furthermore, electrical end effects on the individual fingers have made it useful in the analysis to treat the effective overlap length of each split-finger unit as being a fixed 2/3 wavelengths (at midband) greater than the actual physical overlap length present in the transducer.

Transducer design and construction assumes that all split finger sources in all groups are placed precisely on an imaginary uniform temporal grating covering the entire transducer. (As in a previous definition, this temporal grating refers to the phase delay (seconds) which a surface wave would experience in propagating through the transducer). The grating spacing is constant, of value $1/(2f_o)$ where $f_o$ is the device center frequency. This yields a symmetric frequency response characteristic, except for the minor high frequency emphasis occassioned by the effective 0.05 wavelength shift of the outer split-finger units in each group. Amplitude asymmetry may be purposefully designed into the response while retaining linear phase response by displacing symmetric flanking groups slightly (a fraction of a wavelength) in symmetric fashion with respect to the transducer centerline (see U.S. Pat. No. 3,792,381).

Very accurate surface wave velocity information is essential to accurate placement of the flanking finger groups, thereby preventing the introduction of undesired errors in the filter frequency response. It is well known that the presence of a conducting film on the surface of a piezoelectric substrate will perturb this velocity. The acoustic velocity slowing within a split finger group is not proportional to the metallized fraction duty factor (as suggested by U.S. Pat. No. 3,839,687), but acts rather as though the gaps between adjacent equipotential fingers were also metallized. It is important to take this effect into account when calculating physical placement (as distinct from temporal placement) of flanking finger groups in filter designs of the present type.

More sophisticated analytical models (extant in the published literature on this subject) which more accurately account for performance details of interdigital transducers will naturally lead to the fabrication of filters with superior characteristics.

Weighting by series connection of the weak-group fingers, as in FIGS. 5 and 6, is not as diffraction-free as a completely unapodized array, but provides a great improvement over conventional apodization. Relatively diffraction-free performance should be obtained for arbitrarily short overlap lengths until the interconnection region becomes a significant fraction of the overlap length (FIG. 8). Devices have been built on Y-Z lithium niobate at 44 MHz with total apertures in the 25–50 mil range, corresponding to roughly 8 to 15 wavelengths. This range does not necessarily represent minimum values. The low capacitance, high impedance characteristics of such small devices is desirable for direct interconnection with integrated circuits.

When advantageous, transducers designed according to these principles may also be used in combination with conventional apodized or unapodized configurations, with or without use of the multistrip coupler.

Figure 10:
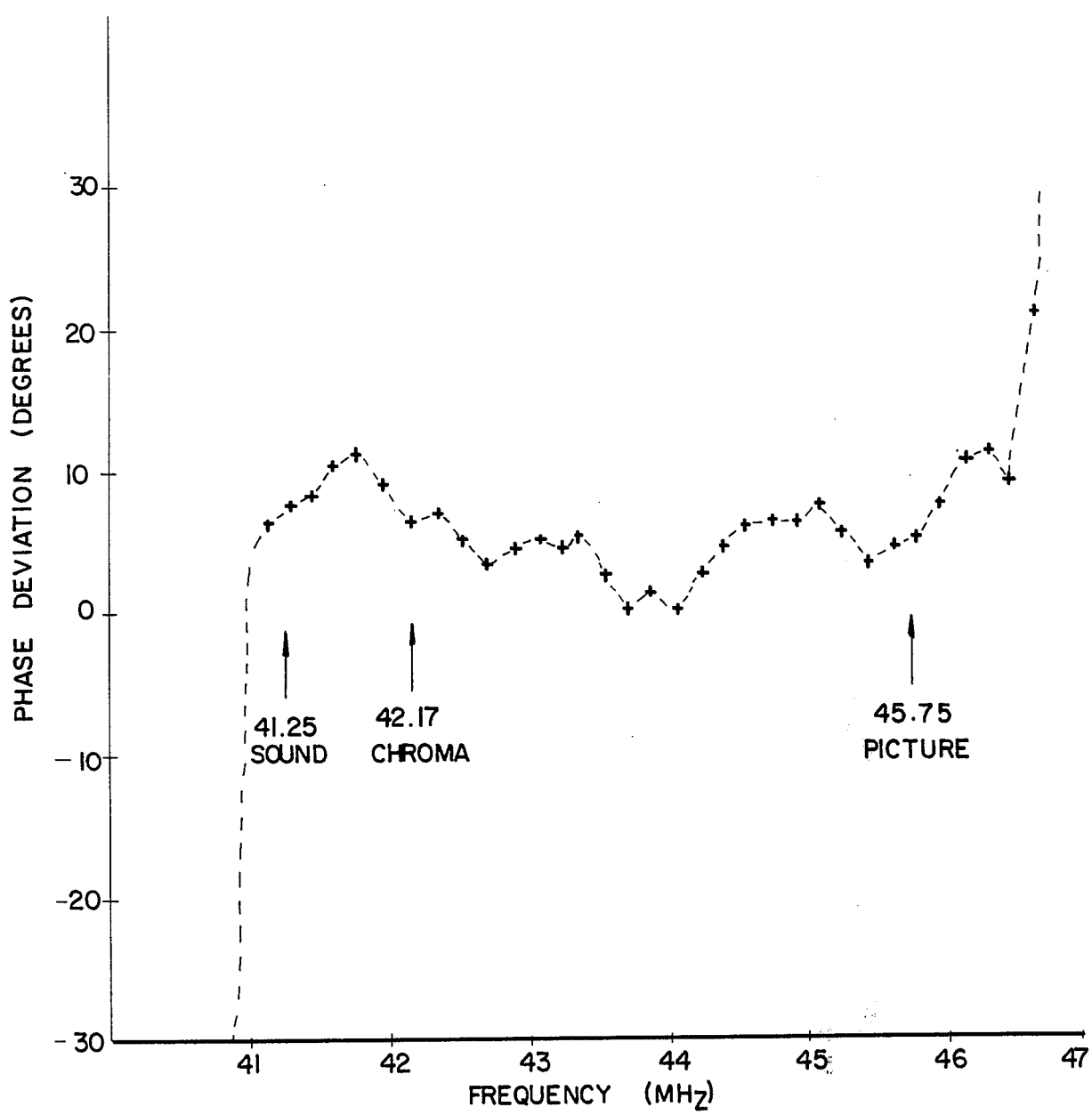
FIG. 10 is a graphic representation of phase linearity for the device of the present invention.

FIG. 9 presents a representative filter characteristic for a surface-wave filter composed of elements similar to those of FIGS. 5 and 6. Devices of this type were fabricated without a multistrip coupler. The back side of the lithium niobate substrate was roughened and otherwise treated with acoustic absorbants to provide suppression of spurious bulk waves. The ends of the substrate were angled, and the top surface in this vicinity treated with acoustic absorbants (as described in U. S. Pat. No. 3,872,410 and elsewhere) to suppress surface wave reflections from the edge of the substrate. Measured phase linearity from another device of this type is shown in FIG. 10.

The techniques described herein are most directly suited for implementation on piezoelectric substrates. The selection and crystallograhic orientation of these is commonly selected for reasons extraneous to the present invention. Single crystal examples include, but are not limited to, Y-Z lithium niobate, Y-X quartz, ST-X quartz, and various orientations of lithium tantalate, bismuth germanium oxide, and bismuth silicon oxide. Poled ferroelectric ceramic compositions such as barium titanate, lead zirconate-titanate and others are also suitable. These techniques are also suitable for various hybrid material configurations in which non-piezoelectric substrates are made useful by the epitaxial growth, deposition, sputtering or mechanical joining of piezoelectric layers (such as zinc oxide, aluminum nitride, any of those listed above, or others) to the surface of a non-piezoelectric substrate such as silicon, fused quartz, sapphire, etc., together with the appropriate electrode configuration.

The transducer electrode patterns described here are conventionally replicated on the substrate from a master mask by a photolithographic process similar to printed circuit fabrication. This involves coating the crystal substrate with a thin metal layer, then covering it with a photoresist fluid which becomes light sensitive when dried. Contact printing follows, with the mask placed over the substrate and the resulting package exposed to light. Exposed resist rinses off during the ensuing development cycle (positive resist), leaving unprotected metal areas which may then be chemically etched or sputtered away. Finally, the remaining resist is stipped off.

The substrate metallization is typically gold or aluminum, applied via vacuum deposition or sputtering over an adhesion-promoting flash of chromium. The metallization is thin, ranging typically from one to five thousand angstroms. This represents a compromise between the high electrical resistance of thinner films and the surface perturbation induced by heavier coatings. Requirements for bond wire adhesion in subsequent operations also argue against excessively thin coatings. Due to these resistive and mass-loading effects, the electrode thickness is a moderately critical parameter in the performance of many devices and must be controlled.

Since the surface wave velocity can differ by 2% in metallized and unmetallized regions, the width of etched electrodes can effect performance in complex devices. Etching consistency, uniformity, and the effects of undercutting thus become factors in device performance, especially in high frequency devices.

The "lift-off" fabrication process permits great consistency in electrode replication. It involves coating the substrate with resist, exposing and developing before metallization. Stripping the resist after metallization removes metal from everywhere except the previously exposed and developed regions. Thus, the etching process is eliminated, and electrode patterns are readily prepared from any adherent combination of metals.

There exists a secondary performance problem intrinsic to surface-wave filters based on transducers of the present design. The problem and the cure are outlined in the paragraphs below.

Published literature (sittig and Coquin, IEEE Trans. Vol. SU-15, No. 2, pp. 111–119; April, 1968) indicates that there is an impedance discontinuity where an acoustic surface wave propagating on a free piezoelectric surface encounters a split-finger (eighth wavelength fingers and gaps) conducting grid. On Y-Z lithium niobate this single discontinuity is of sufficient magnitude to generate a reflected wave at about the −43 dB level.

FIG. 11 suggests how this process may cause difficulties in transducers, such as those of FIGS. 5 and 6. Any portion of the transducer necessarily launches acoustic waves travelling both to the left and to the right. Waves travelling in the undesired leftward direction are customarily absorbed outside the transducer to prevent eventual undesired reflections. This is not possible within the transducer. Thus numerous internal reflections will be unavoidable in a transducer composed of separated finger-groups. Reflections from the rightward travelling (desired) wave are far less important since they must undergo two reflections before emerging in the intended lauch direction.

Examination of the transducer in FIG. 6 reveals the existence of 49 reflection possibilities for leftward travelling waves. Similar reflections can occur in the receiving transducer. A filter composed of two such transducers can thus have nearly a hundred undesired internal reflections from sources (finger groups) of various amplitudes and frequency characteristics. While these all cancel identically at midband ($f_o$), there remains the likelihood of unacceptable behavior elsewhere within the passband.

By employing inactive split finger units to fill in the gaps between flanking groups in the present invention, all but the leftward-most (FIG. 5) of these undesired reflections would be eliminated. The use of series weighting in the active flanking groups complicates the analytical model at the boundary between active and inactive fingers, however, and leads to acoustic wave excitation in this region which is not uniform across the transducer aperture. Furthermore, the capability for introducing asymmetry in the transducer frequency response through shifts in the flanking groups is encumbered.

The solution for internal transducer reflections proposed by the present invention consists in the addition of a single inactive finger at each edge of the finger groups. These fingers are so positioned as to cancel the original reflections without introducing propagation phase errors within the transducer.

Figure 13:
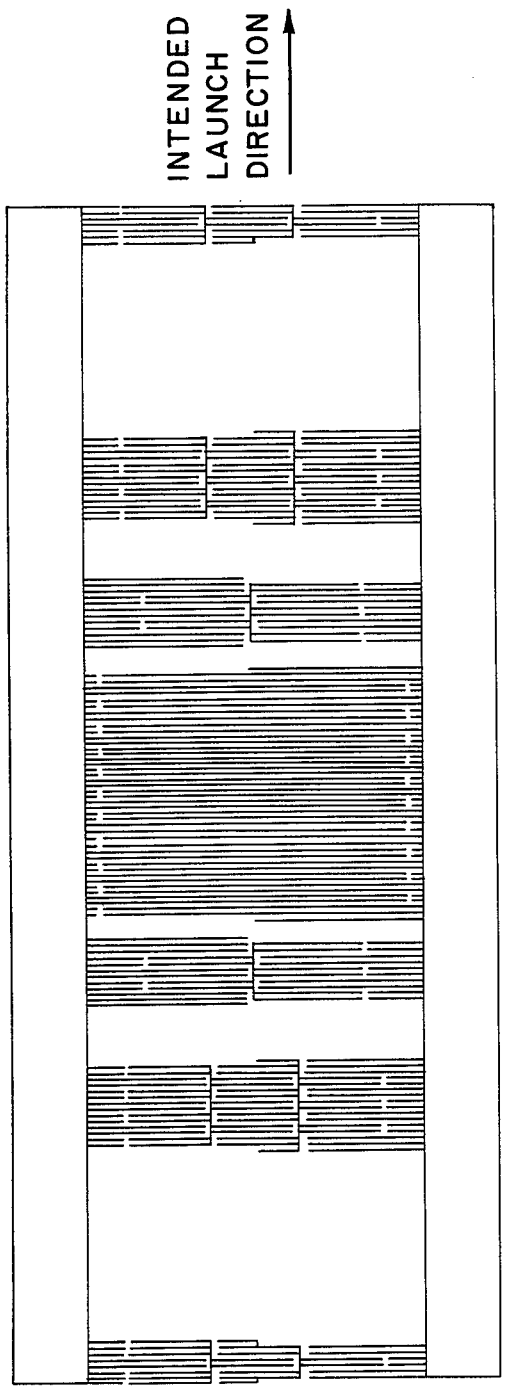
FIG. 13 is a plan view of a further alternate transducer embodiment of the subject invention for an electro-acoustic surface-wave filter.

FIG. 13 shows this solution as applied to the transducer of FIG. 6. FIG. 12 explains the mechanism. The edges of the finger groups are extended by a single $\lambda/8$ finger and gap, corresponding to a $\lambda/4$ increase. This shifts the phase of the reflected wave by $\lambda/2$. Since the group extension covers only half the group aperture, the reflected wave is split into two spatially distinct parts which are 180 degrees out of phase (at midband). The receiving transducer integrates this wave across the aperture of yield approximately zero net response. Only a roughly 10 dB reduction is required in the aggregate reflection, which should be easily provided over the passband by this cancellation process. (When this technique is employed, the amplitude of the detected reflection from any group edge is proportional to $$\cos\left(\frac{\pi}{2}\frac{f}{f_o}\right).$$

where $f_o$ is the midband frequency of the split-finger transducer).

A possible secondary problem intrinsic to this solution is the creation of a non-uniform phase front in the desired wave due to the additional metallization of these inactive fingers. This possibility is eliminated by alternating the location of the half-aperture inactive fingers, as shown in FIGS. 12 and 13. Thus, the total additional metallization is uniform across the transducer aperture. This additional metallization should of course be taken into account during initial artwork design, so that the active fingers are properly placed on the desired temporal grid. Note that this metallization uniformity requirement implies elimination of the single inactive finger at the outermost boundary of the transducer in the intended launch direction. This is shown at the right-hand side of FIG. 13.

The present invention may be subject to many changes and alternatives without departing from the spirit or essential characteristics of the invention. Thus the desired embodiments should in all ways be considered as illustrative and not restrictive of the scope of the invention.

What is claimed is:

1. A transducer for an electro-acoustic surface-wave device, said transducer having center frequency $f_o$, and a frequency domain spectral response, H(f), which has a time domain impulse response, h(t), including:

a. a central group of interdigitated fingers, taken separately producing a central pulse having a Fourier transform with maximum near $f_o$ and a frequency bandwidth B between the two null response points closest to $f_o$; and b. a first pair of flanking finger groups producing pulses spaced approximately 1.5/B from the center of said central pulse, the energy in each pulse of said pairs of flanking pulses being a predetermined fraction less than one of the energy in said central pulse.

2. A transducer according to claim 1 further comprising:

a second pair of flanking finger groups producing pulses spaced approximately 2.5/B from said center of said central pulse, the energy in each pulse of said pairs of flanking pulses being a predetermined fraction less than one of the energy in said central pulse.

3. A transducer according to claim 2 further comprising:

a third pair of flanking finger groups producing pulses spaced approximately 3.5/B from said center of said central pulse, the energy in each pulse of said pair of flanking pulses being a predetermined fraction less than one of the energy in said central pulse.

4. A transducer according to claim 3 further comprising:

a fourth pair of flanking finger groups producing pulses spaced approximately 4.5/B from said center of said central pulse, the energy in each pulse of said pairs of flanking pulses being a predetermined fraction less than one of the energy in said central pulse.

5. The transducer of claim 4 in which the separation of the first, second, third and fourth flanking pulses from the central pulse in the impulse response are given respectively by $$K_1/B, \; K_2/B, \; K_3/B, \; K_4/B$$

where $K_1$, $K_2$, $K_3$, $K_4$ are chosen close to 1.5, 2.5, 3.5 and 4.5 such that if the number of interdigitated fingers in the central group and the particular flanking group are both an even multiple of $1/f_o$, then $$K_n = \frac{I_n B}{2f_o}; \; n = 1, 2, 3, 4$$

where $I_n$ are integers.

6. The transducer of claim 4 in which the separation of the first, second, third and fourth flanking pulses from the central pulse in the impulse response are given respectively by $$K_1/B, \; K_2/B, \; K_3/B, \; K_4/B$$

where $K_1$, $K_2$, $K_3$, $K_4$, are chosen close to 1.5, 2.5, 3.5, and 4.5 such that if the number of interdigitated fingers in the central group and the particular flanking group are both an odd multiple of $1/fo$, then $$K_n = \frac{I_n B}{2f_o}; \; n = 1, 2, 3, 4$$

where $I_n$ are integers.

7. The transducer of claim 4 in which the separation of the first, second, third and fourth flanking pulses from the central pulse in the impulse response are given respectively by $$K_1/B, K_2/B, K_3/B, K_4/B$$

where $k_1, K_2, K_3, K_4$, are chosen close to 1.5, 2.5, 3.5, and 4.5 such that if the number of interdigitated fingers in the central group and the particular flanking group are the one an even and the other an odd multiple of $1/f_o$, then $$K_n = \frac{(J_n + 1/2) B}{2f_o} ; n = 1, 2, 3, 4$$

where $J_n$ are integers.

8. An electro-acoustic surface-wave filter device comprising:
a body of piezoelectric material,
at least two transducers disposed on said body in a spaced configuration, each said transducer having a central frequency $f_o$, and a frequency domain spectral response, $H(f)$, which has a time domain impulse response $h(t)$, a central group of interdigitated fingers taken separately producing a central pulse having a Fourier transform with maximum near $f_o$ and a frequency bandwidth B between the two null response points closest to $f_o$, and at least one flanking group of interdigitated split fingers uniformly spaced on either side of the center of said group at predetermined distances, each said flanking group producing pulses spaced from the center of said central pulse, the energy in each pulse of said pairs of flanking pulses being a predetermined fraction less than one of the energy in said central pulse.

9. An electro-acoustic surface-wave filter device according to claim 8 wherein said piezoelectric body material is selected from the group including Y-Z lithium niobate, Y-X quartz, ST-X quartz, lithium tantalate, bismuth germanium oxide, and bismuth silicon oxide.

10. An electro-acoustic surface-wave filter device according to claim 8 wherein the strengths of said flanking groups are controlled by the number of finger pairs within a group.

11. An electro-acoustic surface-wave filter device according to claim 8 wherein:
the strengths of said flanking groups are controlled by the overlap length of the fingers in each group.

12. An electro-acoustic surface-wave filter device according to claim 8 wherein:
the strengths of said flanking groups are controlled by the strip-gap ratio of the fingers in each group.

13. An electro-acoustic surface-wave filter device according to claim 8 wherein:
said interdigitated fingers of said central group and said flanking groups include split fingers.

14. An electro-acoustic surface-wave filter device according to claim 8 further comprising:
a single inactive eighth wavelength finger and gap on each side of at least one of said groups of split fingers, said inactive fingers subtending approximately 50% of the transducer width.

15. An electro-acoustic surface-wave filter device according to claim 14 in which said inactive fingers are appended to at least two adjacent of said groups of split fingers, said inactive fingers which extend along proximate edges of said adjacent groups being arrayed in complementary fashion such that together they subtend approximately 100% of the transducer width.

* * * * *